(12) United States Patent
Bettinelli

(10) Patent No.: US 8,807,026 B2
(45) Date of Patent: Aug. 19, 2014

(54) METHOD FOR PRINTING A CONDUCTOR IN TWO SUPERIMPOSED LAYERS BY SCREEN-PRINTING

(75) Inventor: Armand Bettinelli, Coublevie (FR)

(73) Assignee: Commissariat a l'energie Atomique et aux Energies Alternatives

( * ) Notice: Subject to any disclaimer, the term of this patent is extended or adjusted under 35 U.S.C. 154(b) by 926 days.

(21) Appl. No.: 12/751,408

(22) Filed: Mar. 31, 2010

(65) Prior Publication Data

US 2010/0252102 A1  Oct. 7, 2010

(30) Foreign Application Priority Data

Apr. 6, 2009 (FR) ...................................... 09 01711

(51) Int. Cl.
B41M 1/12 (2006.01)

(52) U.S. Cl.
USPC ............ 101/129; 101/115; 101/123; 101/486

(58) Field of Classification Search
USPC .......... 101/115, 116, 123, 129, 484, 485, 486
See application file for complete search history.

(56) References Cited

U.S. PATENT DOCUMENTS

| | | | | |
|---|---|---|---|---|
| 4,534,288 | A * | 8/1985 | Brovman | 101/211 |
| 4,546,700 | A * | 10/1985 | Kishner et al. | 101/211 |
| 5,056,430 | A * | 10/1991 | Bayerlein et al. | 101/211 |
| 5,138,667 | A * | 8/1992 | Roch et al. | 382/112 |
| 5,806,424 | A | 9/1998 | Elliot | |
| 5,899,143 | A | 5/1999 | Niestrath et al. | |
| 6,022,154 | A * | 2/2000 | Allen | 400/76 |
| 6,199,480 | B1 * | 3/2001 | Leonhardt et al. | 101/248 |
| 2,807,705 | A1 | 6/2003 | Brunet-Manquat | |
| 6,937,337 | B2 * | 8/2005 | Ausschnitt et al. | 356/401 |
| 1,935,647 | A1 | 6/2008 | Pollet | |
| 7,473,502 | B1 | 1/2009 | Ausschnitt et al. | |
| 7,474,401 | B2 * | 1/2009 | Ausschnitt et al. | 356/401 |
| 8,138,498 | B2 * | 3/2012 | Ghinovker | 257/48 |
| 2002/0026879 | A1 | 3/2002 | Goldstein | |

FOREIGN PATENT DOCUMENTS

EP 1 935 647 A 6/2008
FR 2 807 705 A 10/2001

OTHER PUBLICATIONS

Besi-Vetrella, U. et al.: "Large Area, Screen Printed Silicon Solar Cells with Selective Emitter Made by Laser Overdoping and RTA Spin-on Glasses", $26^{th}$ PVSC, Sep. 30-Oct. 3, 1997, pp. 135-138.
Pirozzi, Luisa et al.: "Innovative applications of laser technology in photovoltaics", SPIE, vol. 2991, pp. 119-128.
Mouhoub, A et al.: "Selective Emitters for Screen Printed Multicrystalline Silicon Solar Cells", Rev. Energ. Ren.: ICPWE (2003), pp. 83-86.
Search Report issued by French Patent Office for priority application FR 09 01711, mailed Apr. 6, 2010.

* cited by examiner

*Primary Examiner* — Ren Yan
(74) *Attorney, Agent, or Firm* — Frommer Lawrence & Haug LLP; Ronald R. Santucci

(57) ABSTRACT

Method for printing on a wafer (1) by screen-printing, characterized in that it comprises the following steps:
 producing at least two first test-patterns (5a-5d) on the surface (4) of the wafer (1);
 printing at least four second test-patterns (6a-6d), distinct from the at least two first test-patterns (5a-5d), during printing on the surface (4) of the wafer (1) by screen-printing;
 measuring the actual distance obtained on the surface (4) of the wafer (1) between the first test-patterns (5a-5d) and the second test-patterns (6a-6d);
 comparing this actual distance with a theoretical distance in order to deduce therefrom the offset of the screen-printing screen (25) of the printing.

16 Claims, 8 Drawing Sheets

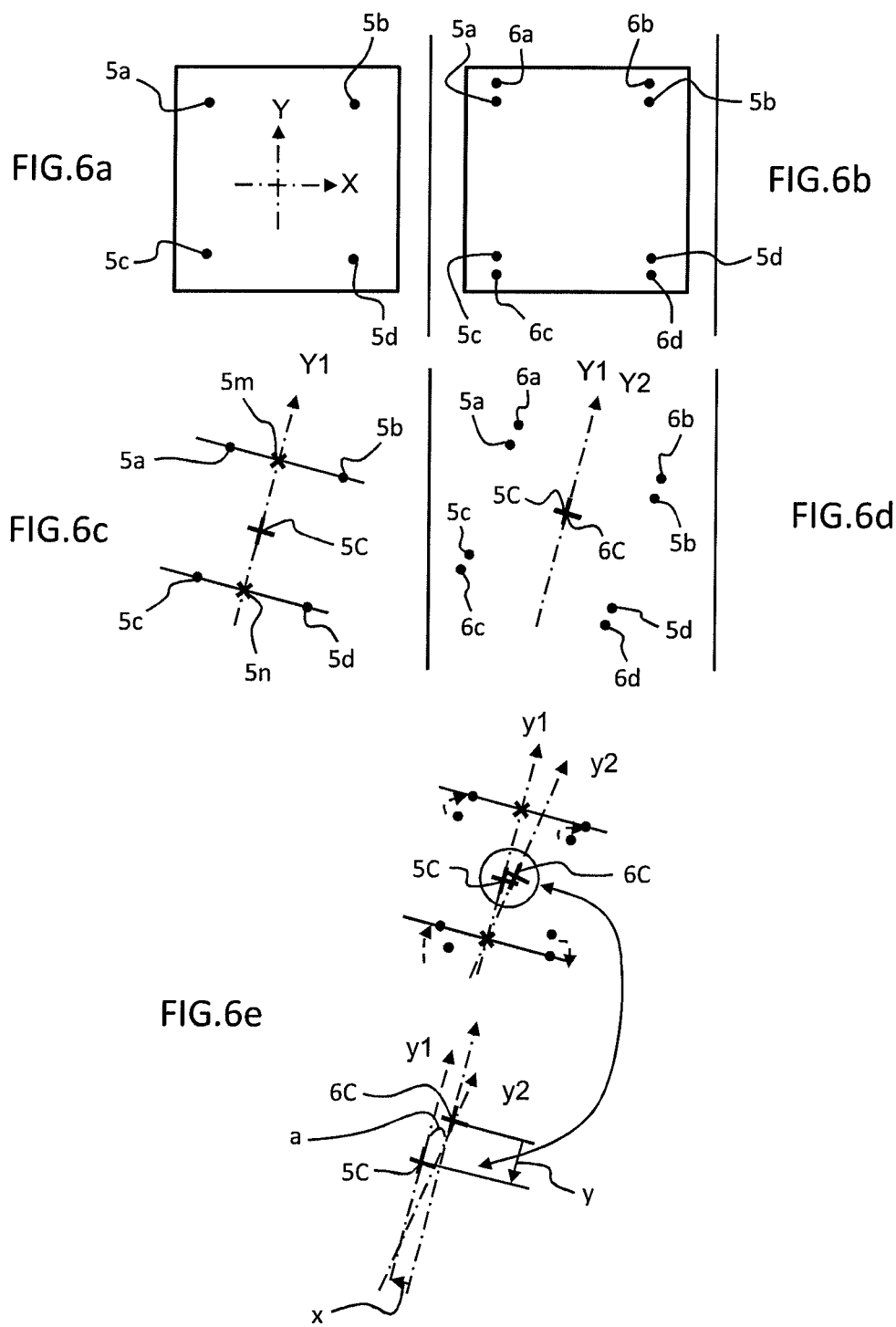

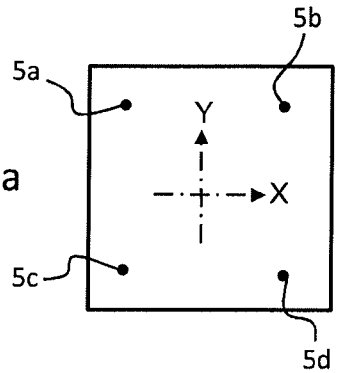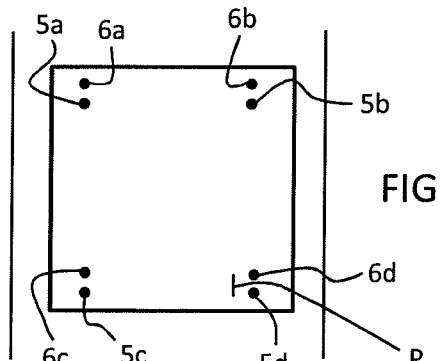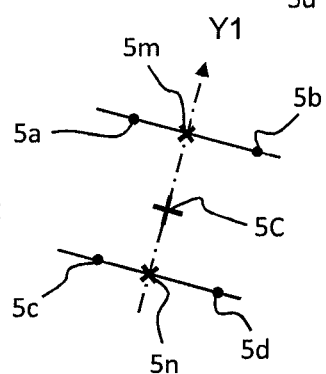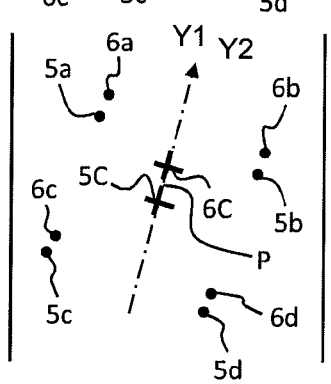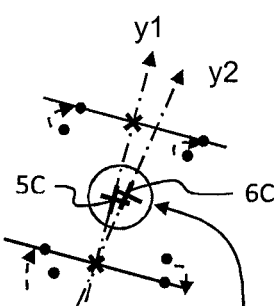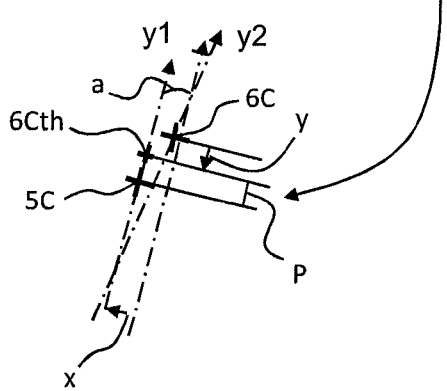

METHOD FOR PRINTING A CONDUCTOR IN TWO SUPERIMPOSED LAYERS BY SCREEN-PRINTING

This application claims priority benefits from French Patent Application No. 09/01711 filed Apr. 6, 2009, the disclosure of which is hereby incorporated by reference.

The invention relates to a method for aligning a screen-printing unit, which in particular is adapted for printing collection conductors in double layers on a photovoltaic cell. It also relates to a printing unit which carries out such a method, to a unit for producing photovoltaic cells, and to a photovoltaic cell and module which are produced by such a unit.

A photovoltaic cell is fabricated with the aid of a so-called "wafer" of semiconductor material, generally silicon. This fabrication requires in particular the formation of electrical conductors on the surface of this wafer. To this end, one method of the prior art consists in depositing a conductive ink on the wafer by screen-printing. As a variant, there are other techniques for producing these electrical conductors.

FIGS. 1 and 2 illustrate this method. Screen-printing is based on the use of a screen or mask 20 positioned above a wafer 1 to be screen-printed, at a distance of the order of one millimeter. A squeegee 22 is moved in the direction of the arrow F, deforming the screen 20 onto the surface 4 of the wafer 1 and exerting a pressure force which deposits some of the ink 21 on the surface 4 of the wafer 1 at points predefined through openings 23 of the screen, in order to form narrow conductors 2 on its surface. These conductors 2 generally have a width greater than that of the opening 23, of the order of 20 micrometers, as shown particularly in FIG. 2.

The electrical property of the conductors 2 which are obtained plays an important role in the final performance of the photovoltaic cell, and in particular is crucial for its conversion efficiency. One characteristic of the screen-printing method described above is that, over time, the screen becomes worn owing to the repetition of its deformations. This is because such a screen experiences high stresses in the photovoltaic cell fabrication process which requires high speeds, of the order of 1200 printings per hour. These stresses lead in particular to progressive deformation of the screen, and therefore deformation of the printed pattern.

In order to overcome these drawbacks, it is known to use an inspection device based on one or more cameras, which observes the semiconductor wafers and detects there integrity, then observes the position of the wafer in order to improve the alignment between the wafer and the screen-printing screen. Such an inspection device makes it possible to achieve sufficient precision, compatible with the desired precision of the order of 50 to 100 micrometers.

In order to improve the performance of the photovoltaic cell, a second method is known which consists in producing the conductors by two superimposed printings, as represented in FIG. 3. The second printing makes it possible to print a second conductive layer 3 by screen-printing with the aid of a separate second screen 25 on the first conductive layer 2 obtained by the first printing. The width of the second layer 3 is similar to the opening 26 of the screen 25 placed bearing on the first layer 2. This characteristic facilitates superposition of the two conductive layers 2, 3. The aim 1s to obtain a thicker final conductor that makes it possible to reduce the resistance of the collection conductors by a factor close to two, which considerably increases the conversion efficiency of the photovoltaic cell. This method, however, must be carried out by two successive printings performed with two different screen-printing heads, based on two different screens 20, 25 in order to make it possible to dry the first conductive layer 2 before superposition of the second layer 3.

Improvement of the photovoltaic cells by the second method with double printing is obtained only on condition that sufficient superposition of the two conductive layers 2, 3 is obtained. This is because if the second layer is poorly superimposed on the first, it leads to a broadening of the conductors which increases the surface area not usable by the cell (surface having a material not sensitive to photons) and consequently reduces the performance of the photovoltaic cell. Now, the phenomenon of the alignment offset of the screens 20, 25 over time is more critical in this double-printing solution owing to the combination of the two screens, both of which deform differently over time. Thus, nowadays this solution requires frequent changing of the screens every 1000 printings, whereas the screen can be kept for 5 to 10,000 printings with the standard single-printing solution. This second method of double printing therefore presents the drawback of requiring greater consumption of screens, which substantially increases its cost. Furthermore, the loss of time caused by changing the screens reduces the productivity of the photovoltaic cell fabrication method.

Finally, the improvement of the photovoltaic cells by the second method with double printing remains theoretical and scarcely applicable owing to the drawbacks mentioned above.

It is thus a general object of the invention to provide a solution for producing an electrical conductor by screen-printing on a wafer, which reduces the drawbacks of the solutions of the prior art.

More precisely, the invention seeks to achieve some or all of the following objects:

It is a first object to the invention to provide a solution for producing an electrical conductor by screen-printing on a photovoltaic cell, allowing the performance of the resulting photovoltaic cell to be optimized.

It is a second object of the invention to provide a solution for producing an electrical conductor by screen-printing on a photovoltaic cell by a high-performance and economical method with high productivity.

To this end, the invention is based on a method for printing on a wafer by screen-printing, characterized in that it comprises the following steps:
  producing at least two first test-patterns on the surface of the wafer;
  printing at least four second test-patterns, distinct from the at least two first test-patterns, during printing on the surface of the wafer by screen-printing;
  measuring the actual distance obtained on the surface of the wafer between the first test-patterns and the second test-patterns;
  comparing this actual distance with a theoretical distance in order to deduce therefrom the offset of the screen-printing screen of the printing.

The printing method may comprise a step of modifying the position of the screen-printing screen of the printing in order to reduce or eliminate its offset.

The first test-patterns may be produced during printing by screen-printing, and by printing at least four first test-patterns.

To this end, the first test-patterns may be printed when printing a first layer of ink on the surface of the wafer, and the second test-patterns may be printed when printing a second layer of ink, which are superimposed on the first layer on the surface of the wafer when there is no offset of the screen-printing screens of the two printings.

Furthermore, the printing method may comprise a step of inspecting the first test-patterns before printing the second test-patterns, which comprises measuring the offset of the first test-patterns with respect to their theoretical position, and comprises a modification of the position of the screen-printing screen of the first printing in order to eliminate or reduce this offset.

The printing method may comprise a step of drying the at least one first test-pattern before printing the at least one second test-pattern.

The first test-patterns and/or the second test-patterns may be distributed at the periphery of the wafer.

The test-patterns may be distributed symmetrically around the same centre of symmetry in their theoretical position, as obtained when printing without an offset of the screen-printing screens.

The test-patterns may be distributed in the four angles if the wafer is a parallelogram.

As a variant, the first test-patterns and the second test-patterns may all be offset in the same way by a distance (P).

The first test-patterns and the second test-patterns may comprise a part of the screen-printed circuit.

The printing method may comprise a step of entering the wafer onto a printing table, a step of positioning the wafer in a printing unit in which it undergoes the second printing, and a step of positioning the wafer in an inspection unit in order to measure and deduce therefrom the offset of the screen-printing screen of the second printing.

The first step of entry on the printing table may position the wafer in the inspection unit in order to measure the position of the test-patterns of the first printing, and the step of positioning the wafer in an inspection unit may consist in positioning the wafer by backwards movement under the same inspection unit as that reached during entry of the wafer on the printing table, and the method may comprise a step of repositioning the wafer under the printing unit without printing it before its exit from the printing table.

The inspection of the second printing in the inspection unit may be carried out only periodically, not for all the wafers.

The invention also relates to a method for fabricating a photovoltaic cell, characterized in that it comprises a method of printing some or all of the collection conductors of the photovoltaic cell as described above.

The invention also relates to a screen-printing device comprising at least one screen-printing unit and at least one inspection unit, characterized in that the screen-printing unit carries out the printing of at least four test-patterns, and in that the device carries out the screen-printing method as described above.

The inspection unit may comprise at least one high-resolution camera and a computer.

Lastly, the invention also relates to a photovoltaic cell, characterized in that it comprises at least one conductor comprising at least two superimposed layers, and at least two first screen-printing test-patterns and at least four second screen-printing test-patterns which are distinct.

It may comprise at least four first screen-printing test-patterns.

These objects, characteristics and advantages of the present invention will be explained in detail in the following description of particular embodiments, given without implying limitation and with reference to the appended figures, in which:

FIG. 1 schematically illustrates a screen-printing method according to the prior art.

FIG. 2 schematically represents the result obtained by a first screen-printing method according to the prior art.

FIG. 3 schematically represents the result obtained by a second screen-printing method according to the prior art.

FIG. 4 schematically illustrates a wafer after a first printing according to one embodiment of the invention.

FIG. 5 schematically illustrates the same wafer after the second printing according to the embodiment of the invention.

FIGS. 6a to 6e represent the method for determining the offset of the second printing according to one embodiment of the invention.

FIGS. 7a to 7e represent the method for determining the offset of the second printing according to another embodiment of the invention.

Figure 10:
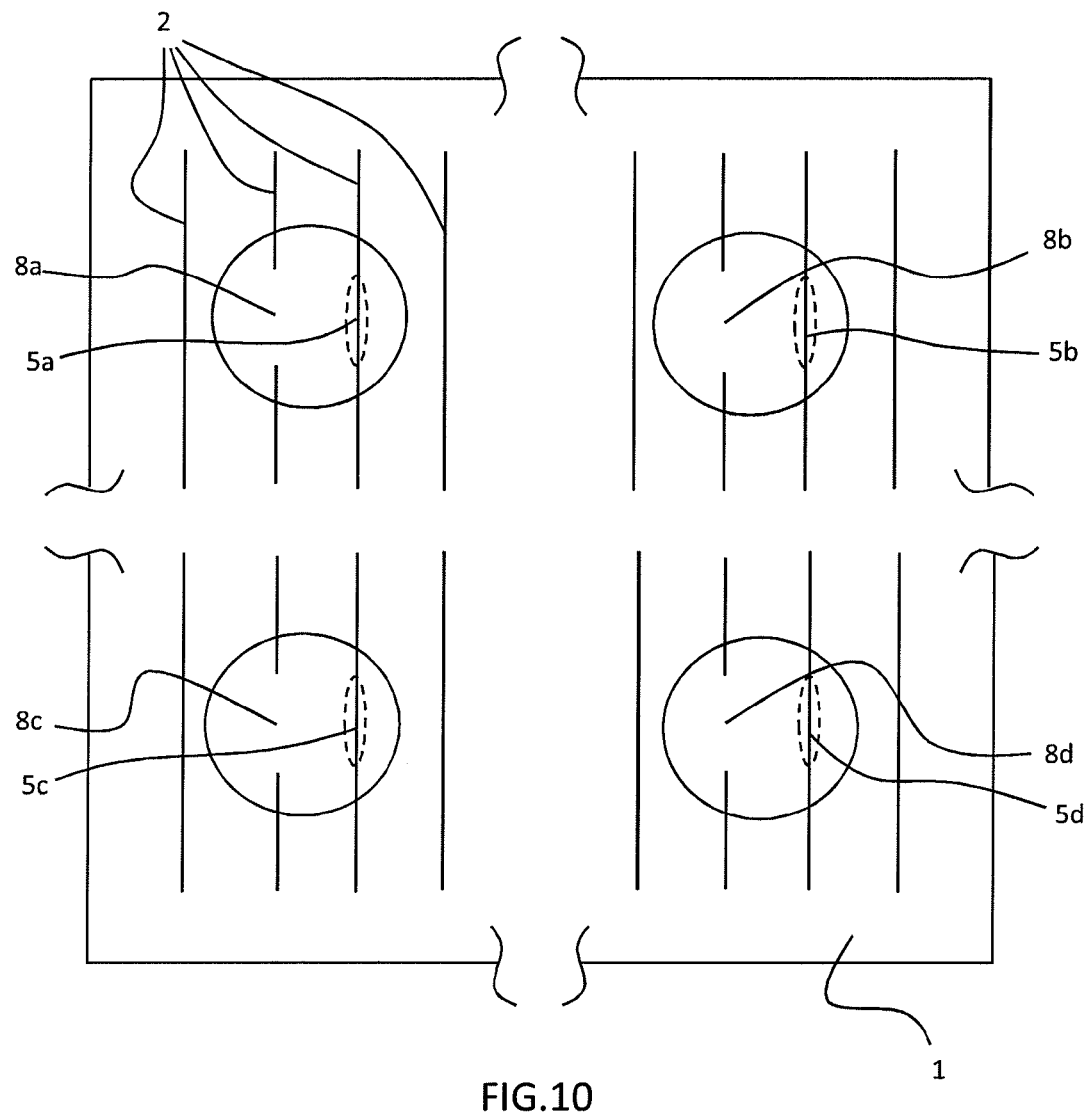

FIG. 10 schematically illustrates a wafer after a first printing according to another embodiment of the invention.

Figure 11:
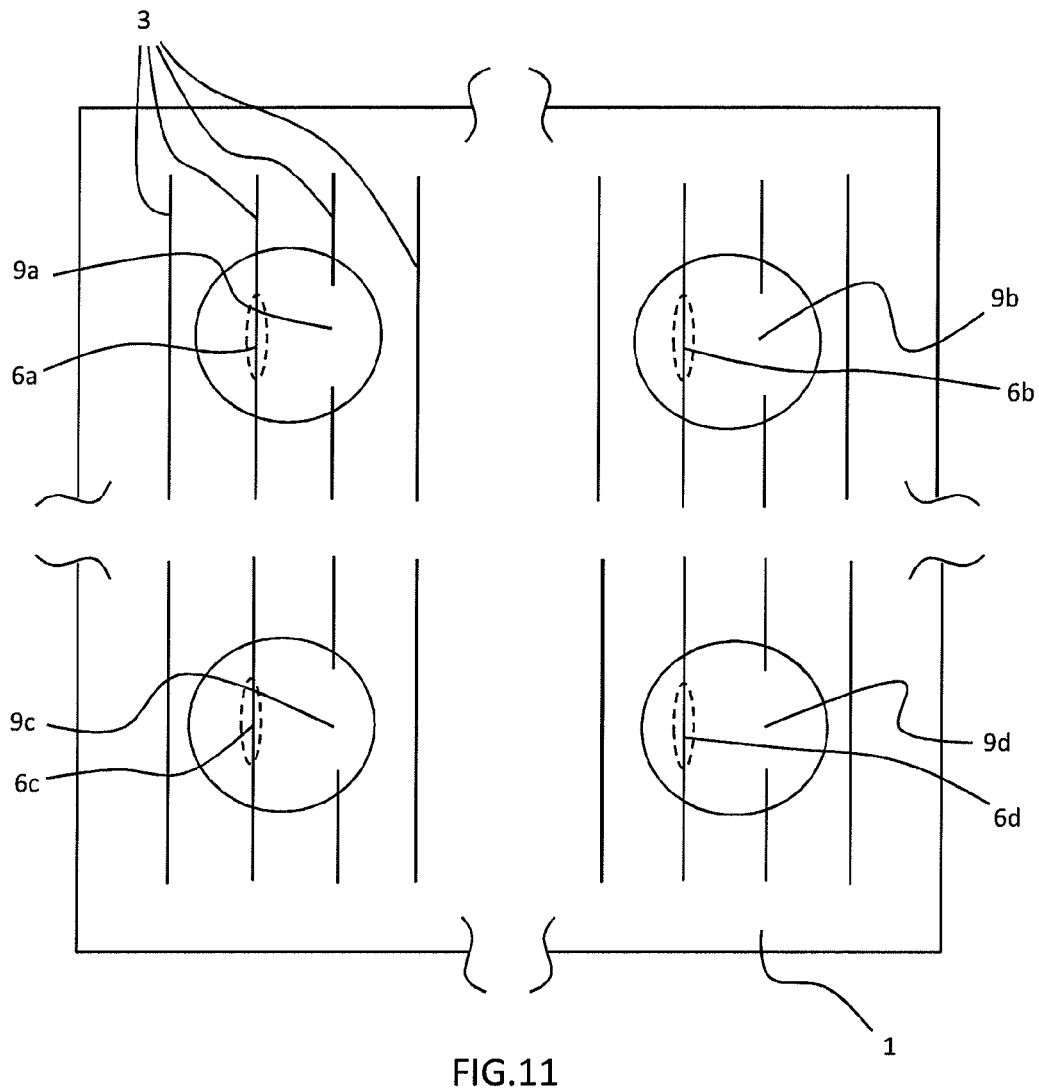

FIG. 11 schematically illustrates the wafer after the second printing according to this other embodiment of the invention.

The invention is based on the use of an inspection device for correcting the alignment errors in a device carrying out double printing in order to form conductors in two superimposed layers, at least the second of which is produced by screen-printing.

To this end, the invention proposes to produce a first conductive layer on a wafer by any method, for example by adding ink by an inkjet or screen-printing method, or by one of the two methods known as "dispensing" or "lift-off". As a variant, the first layer may be produced by using etching pastes, laser ablation, or full-wafer deposition followed by photolithography and etching.

Lastly, the invention makes it possible to achieve a productivity equivalent to that of a standard solution with only one printing, and to obtain photovoltaic cells with a high conversion efficiency owing to their thick collection conductors. It is particularly suitable for the fabrication of photovoltaic cells by double screen-printing.

However, it remains suitable for any fabrication of electronic components needing the formation of two networks which require precise relative alignment, at least the second of which is produced by screen-printing.

Thus, these may be two superimposed levels, for example two levels of metallic conductors, but also two levels of any materials. This may in particular be used favourably for the production of photovoltaic cells having selective emitters, for example by aligning the screen-printing of a metallic second level on a first level consisting of an emitter pattern made of heavily doped silicon.

Thus, they may more generally be two patterns which are not necessarily superimposed but need to have precise relative alignment, at least the second of which is produced by screen-printing, for example two patterns side-by-side such as two interdigitated patterns for which the alignment precisions provided by the invention for the levels will make it possible to reduce the distance between the two patterns. This may in particular be used favourably for the production of two interdigitated conductor levels of photovoltaic cells with rear-face contacts (improvement of the performance by reducing the spaces between the zones with opposite polarities).

In the following description, the same references will be used to denote similar elements.

The printing and inspection method according to one embodiment of the invention, based on the superposition of two layers of conductive ink by screen-printing, will now be described in detail.

Figure 1:
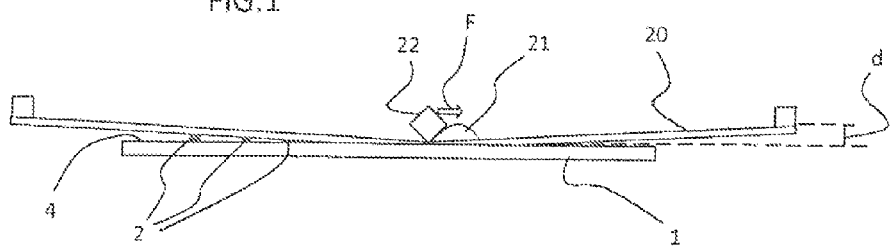
Figure 2:
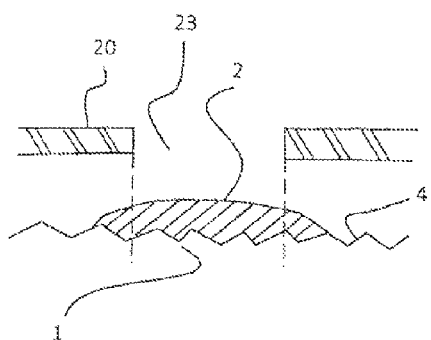
Figure 3:
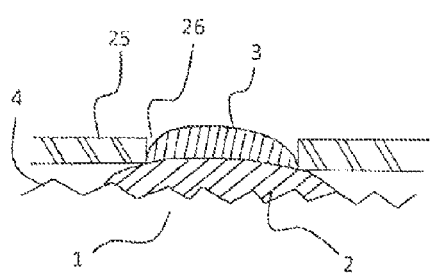
Figure 4:
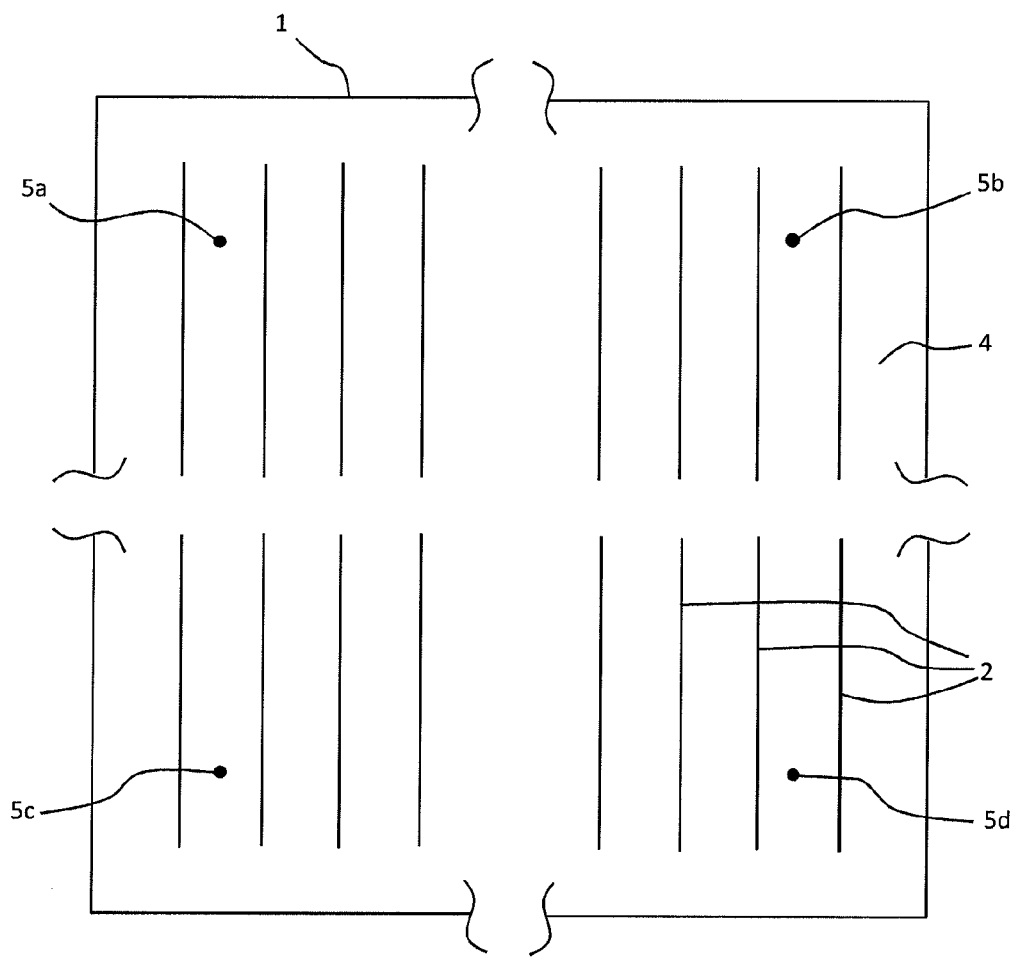

FIG. 4 represents a first step of the method, carried out during the first printing by screen-printing, which makes it possible to print the first layer 2 of the conductors on the surface 4 of the wafer 1.

According to an essential element of the invention, this first printing prints first alignment patterns or first test-patterns 5a, 5b, 5c, 5d, the only function of which is to make it possible to determine the actual position of the first printing on the wafer by observing their position in an inspection device, based on cameras.

Thus, a second step of the method consists in inspecting the result obtained with the first printing. This inspection makes it possible to recognize the first alignment patterns 5a to 5d, and to locate them precisely.

In certain cases, it may be advantageous to calculate the difference of their actual position relative to their theoretical position, defined by the position obtained with a new and perfectly aligned screen. This difference may be taken into account by a first correction to be applied during the next first printing.

Figure 5:
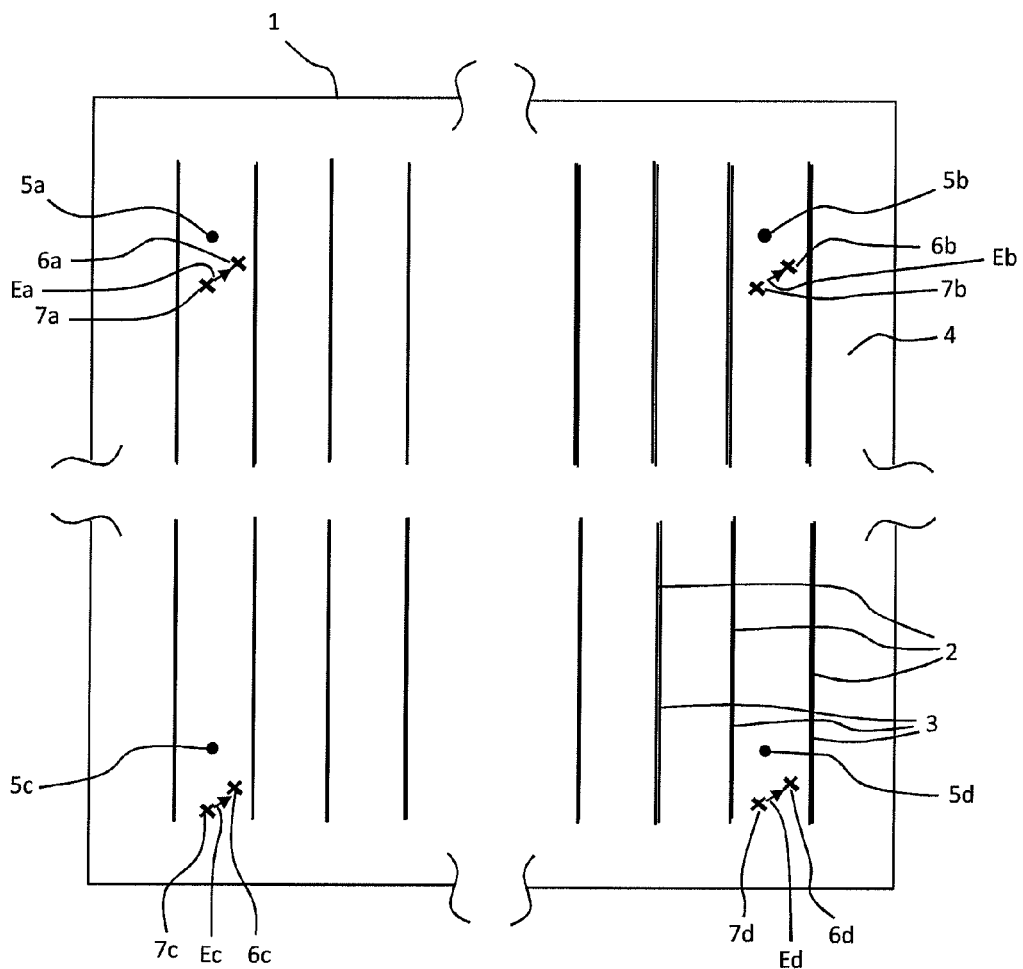

Next, a third step of the method consists in a second printing, represented in FIG. 5, during which a second conductive layer 3 will be superimposed on the first conductive layer 2. According to another essential element of the invention, this second printing prints inter alia second alignment patterns or second test-patterns 6a, 6b, 6c, 6d.

Next, a fourth step similar to the second makes it possible to detect the positioning difference Ea to Ed of the second test-patterns 6a to 6d relative to their theoretical position 7a to 7d defined by the result obtained with the aid of a new, undeformed and perfectly aligned screen. The theoretical location 7a to 7d of the second test-patterns is obtained by taking into account the location data of the first test-patterns 5a to 5d. The theoretical position of the second test-patterns is calculated on the basis of the location of the first test-patterns, taking into account their theoretical relative offset, that is to say with perfectly aligned screen-printing screens without deformation. The difference Ea to Ed obtained therefore corresponds to the relative distance of the second test-patterns with respect to the first, and makes it possible to determine the residual positioning differences between the two printings.

The production of the above test-patterns represents an illustration by way of example, and there are very many possibilities. For example, the first and/or second alignment patterns could be part of the conductors 2, 3. However, it is advantageous to dissociate the inspection function from the actual structure of the photovoltaic cell. It is thus possible to give the first and/or second alignment patterns 5a to 5d, 6a to 6d shapes and dimensions which are ideal for their optical inspection. These patterns may thus have a small size in order to minimize the surfaces not receptive to photons, and they may for example have a partially spherical shape with a diameter of the order of 100 micrometers, or the shape of rods preferably oriented in the same direction as the collection conductors and having a size for example equal to 300×70 micrometers, or a cross shape. Moreover, these test-patterns may lie at any position on the surface 4 of the wafer 1, preferably at the periphery of the wafer or in the angles for a wafer in the shape of a parallelogram. Furthermore, their number must be greater than or equal to four in order to obtain sufficient information about the deformation of the screens and the offset of the printings. The second test-patterns may also advantageously have a different appearance from the first, so as to be differentiated easily. In all cases, the second test-patterns will be distinct from the first, in order to allow their recognition and effective optical exploitation.

According to an alternative embodiment, the alignment patterns may be integrated within the conductors 2. To this end, certain parts of the conductors 2 may be printed only during the first printing, and others only during the second printing. For example, FIGS. 10 and 11 represent an implementation of this variant in which the first printing represented in FIG. 10 shows zones 8a to 8d for which the conductors 2 are not printed. Likewise, FIG. 11 represents the second printing carried out, in which the zones 9a to 9d of the conductors 3 are not printed, these zones being distinct from the zones 8a to 8d. All these zones may advantageously be arranged in the angles of the wafer 1. Thus, when the two printings are carried out, continuity of all the conductors 2, 3 is in fact obtained. The device for inspection or visualization of the alignment will be focused on these particular zones in order to visually analyse the alignment defects, particularly the zones 5a-5d and 6a-6d.

FIGS. 6a to 6e illustrate an embodiment of the invention which is based on the positioning of four first test-patterns 5a to 5d in the first printing layer, then four second test-patterns 6a to 6d in the second printing layer, these eight test-patterns being distributed symmetrically around a reference frame X, Y so as to benefit from the same theoretical centre or centroid 5C, 6C. This geometry makes it possible to work on the basis of straight lines Y1, Y2 which respectively pass through two midpoints 5m, 5n defined by the first test-patterns 5a, 5b and 5c, 5d, and similarly by two midpoints defined by the second test-patterns 6a, 6b, and 6c, 6d. In a situation of perfect alignment, the two straight lines Y1 and Y2 will be superimposed. FIG. 6e illustrates the situation after wear of the screens. The offset between the two straight lines Y1, Y2 makes it possible to define the relative nonalignment between the first and second printings. This offset is defined by the three values x, y, a, (x, y) representing the relative displacement vector between the centroids 5C, 6C and a representing the angle between the straight lines Y1, Y2. These three values are calculated by the inspection and correction device, and are used as a basis for the alignment of the next printings.

FIGS. 7a to 7e illustrate a variant of the previous embodiment of the invention, in which the first and second test-patterns 5a to 5d, 6a to 6d are all offset in the same way by a distance P. The respective centres or centroids 5C, 6C of the first and second test-patterns are therefore likewise offset by the same distance P, and the two straight lines Y1, Y2 defined as above are aligned. FIGS. 7b and 7d represent these various test-patterns and points. FIG. 7e shows an offset obtained after wear, in which the centroid 6C of the second test-patterns is offset relative to its theoretical position 6Cth which would be obtained with an offset P as represented in FIG. 7d. It is thus possible to measure any theoretical offset defined by the three values x, y, a as in the previous example.

It is to be noted that the offset between the first and second test-patterns was measured on the basis of comparing the offset of their respective centroid in the examples above. However, any other equivalent method could be used for measuring some or all of the offset between the test-patterns.

The invention also relates to a device for producing at least two layers by screen-printing on a wafer of the type intended for a photovoltaic cell, which comprises a device for inspection or visualization of the alignment by carrying out the method described above. This inspection device may comprise a plurality of high-precision cameras, for instance four cameras with a resolution of between 1 or 2 million pixels, each respectively processing the alignment patterns 5a to 5d, and 6a to 6d. As a variant, a single camera with stronger resolution, such as of the order of 10 million pixels, could observe all the alignment patterns and achieve an equivalent result. It is to be noted that this solution may be combined with inspection of all the wafer 1, for example with the aid of a central camera having a wide viewing angle. Next, this camera or these cameras transmit(s) the observed images to a processing unit, comprising a computer which comprises software carrying out the method for aligning the screen-printing device as described above.

Figure 8:
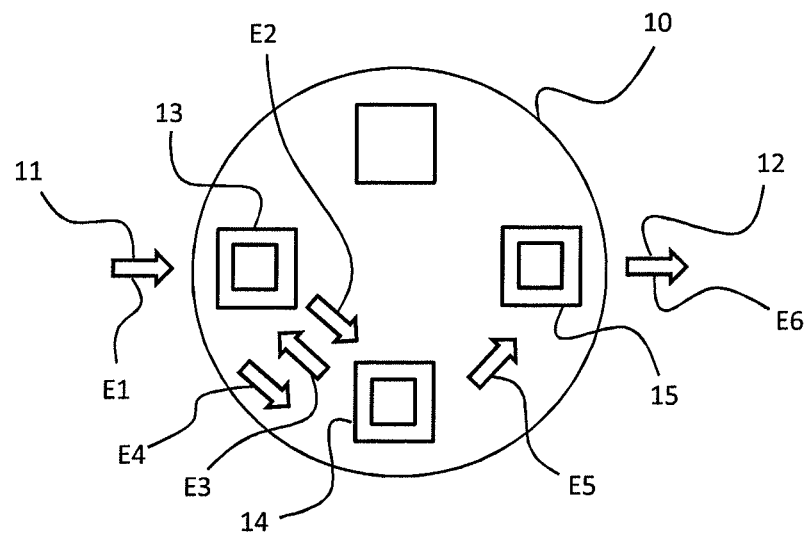
FIG. 8 represents a printing unit according to one embodiment of the invention.

FIG. 8 thus represents a screen-printing station 10 which is in the form of a rotating table. The wafers arrive via an entry 11 on the screen-printing station 10, and they emerge via an exit 12. Two separate but similar tables are used respectively to carry out the first printing and to carry out the second printing. As a variant, the first layer could be produced by a technique other than screen-printing, as mentioned above, in which case the device of the first layer would then differ from that of the second, screen-printing layer.

In the case of the second printing, as represented in FIG. 8, the wafers therefore enter onto the printing table 10 with a view to carrying out the second printing via the entry 11. First printing has therefore already been carried out on a preceding printing table (not shown). The first step E1 upon this arrival consists in carrying out a first inspection in the inspection unit 13, in order to determine the offset of the first test-patterns caused by the misalignment between the wafer and the screen of the first screen-printing table. Next, in a second step E2, the wafers are sent to a printing unit 14 in which they undergo the second printing, making it possible to produce the second layer 3 of conductive ink. In a third step E3, the wafers are returned under the inspection table 13 in order to carry out a new inspection of the relative offset between the first and second printings, caused by the misalignment of the wafer with the second printing screen. Following the latter inspection, the wafer is then conveyed to a control unit 15 in a fifth step E5, after it has passed again over the printing table in a fourth step E4 during which no printing is carried out. Finally, during a step E6, the wafer is sent out of the screen-printing table via the exit 12.

Figure 9:
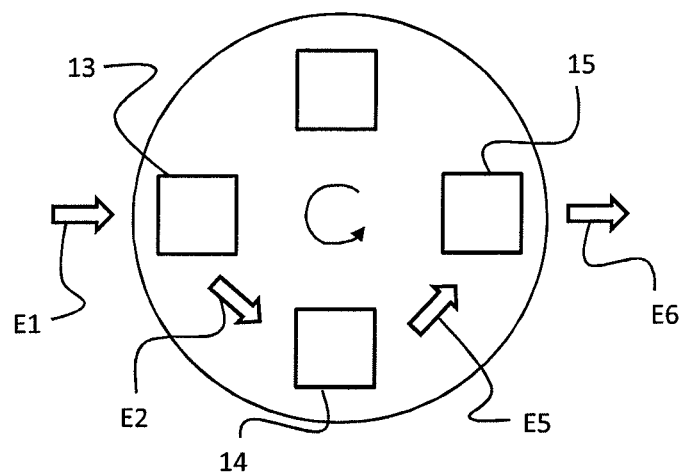
FIG. 9 represents a way of using the printing unit according to the embodiment of the invention.

According to an advantageous embodiment of the invention, the above process of aligning the second screen is not carried out for each wafer travelling over the screen-printing table 10, but according to a predefined period. For example, since the offset is caused by the two screens are very gradual, the movement explained above may be carried out only every 500 wafers, which reduces the number of steps E3, E4 actually carried out, these involving a return journey of a wafer and a reduction in the productivity of the overall fabrication method. Advantageously, inspection of the second printing may be carried out with a period greater than or equal to every 200 wafers. Thus, overall, carrying out the method of the invention leads to negligible production slowdown of the photovoltaic cells, and the capacity of the production line is affected little by carrying out the invention. For all the intermediate wafers for which the second inspection is not carried out, the movement obtained is simplified as represented in FIG. 9, in which the two steps E3, E4 are not carried out, the screen-printing of these wafers being carried out by using the last offset calculated.

As a variant, the above device could be modified in order to include a second inspection unit arranged after the printing unit 14, in order to avoid the return journey of steps E3, E4. This equivalent alternative embodiment of the method of the invention would make it possible to accelerate the production line, but would induce an extra installation cost relative to the device illustrated in FIGS. 8 and 9.

Thus, the invention offers the advantage of making it possible to use the method of printing on a photovoltaic cell wafer by screen-printing with a double printing method, while ensuring superposition of the two printings with high precision, over a long period of time which may extend beyond 10,000 printings.

The preferred embodiment of the invention has been described with superposition of two printings by screen-printing, using four test-patterns in each printing step. The first layer may however be produced by any other technique, as mentioned, and only two test-patterns may be sufficient for this first layer, only the second printing requiring the production of at least four test-patterns in order to obtain the amount of information sufficient to determine the error produced by the particular deformation of the screen-printing screen in all directions, combined with its superposition on a first layer.

The invention claimed is:

1. Method for printing on a wafer for a photovoltaic cell by screen-printing electrical conductors, wherein the method comprises:
   producing at least two first test-patterns for a first conductive layer on the surface of the wafer;
   printing at least four second test-patterns for a second conductive layer, distinct from the at least two first test-patterns, during printing on the surface of the wafer by screen-printing with screen-printing screen;
   measuring the actual distance obtained on the surface of the wafer between the first test-patterns and the second test-patterns;
   comparing this actual distance with a theoretical distance in order to deduce therefrom an offset of the screen-printing screen of the printing caused by a deformation of the screen-printing screen, wherein the theoretical distance is a distance defined by a alignment of the screen printing without deformation of screen-printing screen,
   wherein the offset determined by the comparison is used to correct a misalignment caused by the deformation of the screen-printing screen.

2. Method for printing on a wafer by screen-printing according to claim 1, the method further comprises a step of modifying the position of the screen-printing screen of the printing in order to reduce or eliminate its offset.

3. Method for printing on a wafer by screen-printing according to claim 1, wherein the first test-patterns are produced during printing by screen-printing with a first screen-printing screen, and in that at least four first test-patterns are printed with a second screen-printing screen.

4. Method for printing on a wafer by screen-printing according to claim 3, wherein the first test-patterns are printed when printing a first layer of ink on the surface of the wafer, and in that the second test-patterns are printed when printing a second layer of ink, which is superimposed on the first layer on the surface of the wafer when there is no offset of the screen-printing screens of the two printings.

5. Method for printing on a wafer by screen-printing according to claim 3, wherein the first test-patterns and the second test-patterns comprise a part of the screen-printed circuit.

6. Method for printing on a wafer by screen-printing according to claim 3, wherein the offset determined by the comparison is used to correct the misalignment caused by a deformation in either the first screen-printing screen or the second screen-printing screen or both.

7. Method for printing on a wafer by screen-printing according to claim 1, the method further comprises a step of inspecting the first-patterns before printing the second test-patterns, which comprises measuring the offset of the first test-patterns with respect to their theoretical position, and in that it comprises a modification of the position of the screen-printing screen of the first printing in order to eliminate or reduce this offset.

8. Method for printing on a wafer by screen-printing according to claim 1, the method further comprises a step of drying the first test-patterns before printing the second test-patterns.

9. Method for printing on a wafer by screen-printing according to claim 1, wherein the first test-patterns and/or the second test-patterns are distributed at the periphery of the wafer.

10. Method for printing on a wafer by screen-printing according to claim 9, wherein the test-patterns are distributed symmetrically around the same centre of symmetry in their theoretical position, as obtained when printing without an offset of the screen-printing screens.

11. Method for printing on a wafer by screen-printing according to claim 1, wherein the test-patterns are distributed in the four angles if the wafer is a parallelogram.

12. Method for printing on a wafer by screen-printing according to claim 1, wherein, the first test-patterns and the second test-patterns are all offset in the same way by a distance.

13. Method for printing on a wafer by screen-printing according to claim 1, the method further comprises a step of entering the wafer onto a printing table, a step of positioning the wafer in a printing unit in which it undergoes the second printing, and a step of positioning the wafer in an inspection unit in order to measure and deduce therefrom the offset of the screen-printing screen of the second printing.

14. Method for printing on a wafer by screen-printing according to claim 13, wherein the first step of entry on the printing table positions the wafer in the inspection unit in order to measure the position of the test-patterns of the first printing, and in that the step of positioning the wafer in an inspection unit consists in positioning the wafer by backwards movement under the same inspection unit as that reached during entry of the wafer on the printing table, and in that it comprises a step of repositioning the wafer under the printing unit without printing it before its exit from the printing table.

15. Method for printing on a wafer by screen-printing according to claim 13, wherein the inspection of the second printing in the inspection unit is only carried out periodically, not for all the wafers.

16. Method for printing on a wafer by screen-printing according to claim 1, the method further comprises a step of fabricating a photovoltaic cell by printing some or all of the collection conductors of the photovoltaic cell.

* * * * *